(12) United States Patent
Park et al.

(10) Patent No.: US 12,154,017 B2
(45) Date of Patent: Nov. 26, 2024

(54) INTEGRATED CIRCUIT EMULATING NEURAL SYSTEM WITH NEURON CIRCUIT AND SYNAPSE DEVICE ARRAY AND FABRICATION METHOD THEREOF

(71) Applicants: Seoul National University R&DB FOUNDATION, Seoul (KR); Gachon University of Industry-Academic cooperation Foundation, Seongnam-si (KR)

(72) Inventors: Byung-Gook Park, Seoul (KR); Seongjae Cho, Seoul (KR)

(73) Assignees: Seoul National University R&DBFoundation, Seoul (KR); Gachon University of Industry-Academic Corporation Foundation, Seongnam-Si (KR)

( * ) Notice: Subject to any disclaimer, the term of this patent is extended or adjusted under 35 U.S.C. 154(b) by 1162 days.

(21) Appl. No.: 15/895,255

(22) Filed: Feb. 13, 2018

(65) Prior Publication Data

US 2018/0336451 A1    Nov. 22, 2018

(30) Foreign Application Priority Data

May 19, 2017   (KR) .................. 10-2017-0062097
Nov. 17, 2017   (KR) .................. 10-2017-0153493

(51) Int. Cl.
*G06N 3/04* (2023.01)
*G06F 9/455* (2018.01)
(Continued)

(52) U.S. Cl.
CPC ............... *G06N 3/04* (2013.01); *G06F 9/455* (2013.01); *G06F 9/45504* (2013.01);
(Continued)

(58) Field of Classification Search
CPC ................ H01L 21/1203; H01L 21/84; H01L 2224/48227; H01L 27/1203;
(Continued)

(56) References Cited

U.S. PATENT DOCUMENTS 5,170,071 A * 12/1992 Shreve .................. G06N 3/063
706/43
5,831,057 A * 11/1998 Tully ............... C07K 14/43581
536/23.1

(Continued)

FOREIGN PATENT DOCUMENTS

KR     10-1528802        6/2015
WO   WO2010151844 A2 * 10/2010 ........... H01L 31/042

OTHER PUBLICATIONS

WO 2010/15 844 A2, Doolittle et al (priority date Jun. 25, 2009). (Year: 2009).*

(Continued)

*Primary Examiner* — Ratisha Mehta
(74) *Attorney, Agent, or Firm* — Gerald E. Hespos; Michael J Porco

(57) ABSTRACT

An integrated circuit emulating a neural system and a fabricating method thereof are provided. A synapse device array that imitates a brain neural system (i.e., a central nervous system) requiring high integration on the same substrate is formed by stacking one or more layers on a lower portion, and a neuron circuit of a peripheral nervous system having sensory and motor neurons connected to the brain neural system is formed on an upper portion.

4 Claims, 4 Drawing Sheets

(51) Int. Cl.
*G06N 3/065* (2023.01)
*H01L 21/20* (2006.01)
*H01L 21/84* (2006.01)
*H01L 27/02* (2006.01)
*H01L 27/06* (2006.01)
*H01L 27/12* (2006.01)

(52) U.S. Cl.
CPC ......... *G06N 3/065* (2023.01); *H01L 21/2007* (2013.01); *H01L 21/84* (2013.01); *H01L 27/0207* (2013.01); *H01L 27/0688* (2013.01); *H01L 27/1203* (2013.01); *H01L 2224/48227* (2013.01); *H01L 2924/00014* (2013.01); *H01L 2924/15311* (2013.01)

(58) Field of Classification Search
CPC ............. H01L 27/0207; H01L 21/2007; H01L 27/0688; H01L 2924/00014; H01L 2924/15311; H01L 2924/14; G06J 9/455; G06N 3/04; G06N 3/02; G06N 3/08; G06N 3/0635; G06N 3/065; G06F 9/45504; G06F 9/455
See application file for complete search history.

(56) References Cited

U.S. PATENT DOCUMENTS

| | | | |
|---|---|---|---|
| 9,564,587 B1* | 2/2017 | Jo | H10B 63/20 |
| 2003/0206437 A1* | 11/2003 | Diorio | H01L 27/11558 |
| | | | 365/185.03 |
| 2009/0292661 A1* | 11/2009 | Haas | G06N 3/088 |
| | | | 706/33 |
| 2011/0119214 A1* | 5/2011 | Breitwisch | G06N 3/0635 |
| | | | 706/33 |
| 2011/0169136 A1* | 7/2011 | Pickett | H10B 63/00 |
| | | | 257/E29.325 |
| 2016/0310731 A1* | 10/2016 | Dixon | A61F 5/0127 |
| 2017/0207214 A1* | 7/2017 | Or-Bach | H01L 27/0694 |
| 2017/0330070 A1* | 11/2017 | Sengupta | H10B 63/20 |
| 2018/0165573 A1* | 6/2018 | Hsu | G06N 3/0454 |
| 2018/0226453 A1* | 8/2018 | Yi | G11C 13/0007 |
| 2018/0285724 A1* | 10/2018 | Saito | G06G 7/60 |
| 2018/0300599 A1* | 10/2018 | Fetterolf | G06N 3/0635 |
| 2018/0330228 A1* | 11/2018 | Koelmans | G06N 3/08 |
| 2019/0244933 A1* | 8/2019 | Or-Bach | G11C 29/76 |

OTHER PUBLICATIONS

Frontiers in Neuroscience, vol. 5, Article 73, May 2011.
Or-Bach et al. Provisional application filing date Oct. 10, 2016.

* cited by examiner

FIG. 1(a)
(Prior Art)

Current
3D LSI Technology

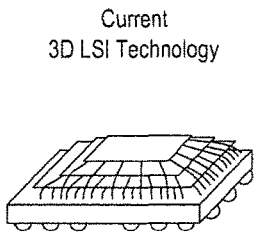

- Less space
- Too much restrictions
- Inefficiency
- Not cost-effective

FIG. 1(b)
(Prior Art)

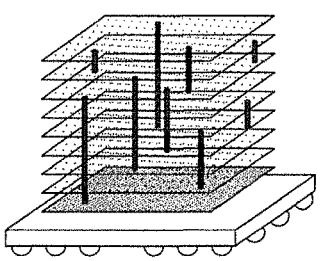

- Just 1um through-hole with no restriction
- Die size optimization for higher yield
- Processor, Memory, CMOS sensor, Digital I/O, Analog I/O, etc.
- Cost-effective FIG. 1(c)
(Prior Art)

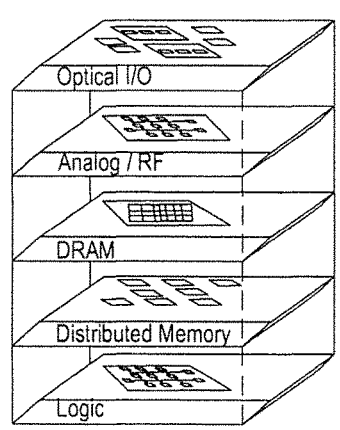

FIG. 2
(Prior Art)

| Techniques | | Advantages | Drawbacks |
|---|---|---|---|
| "Surface" bonding | | Hermetic | Flat surface required |
| | Anodic | strong bond | high-voltage |
| | Fusion (Direct) | strong bond | high temp |
| | Surface-activated | varies | varies |
| Metallic interlayer | | Hermetic<br>Non-flat surface ok | Specific metals required |
| | Eutectic | strong bond | flat surface req'd |
| | Thermocompression | non-flat surface ok | high force |
| | Solder | self-aligning | solder flow possible |
| Insulating interlayer | | Non-flat surface ok | varies |
| | Glass frit | Hermetic<br>common in MEMS | large area<br>medium-hi temp |
| | Adhesive | versatile | non-hermetic |

FIG. 3(a)
(Prior Art)
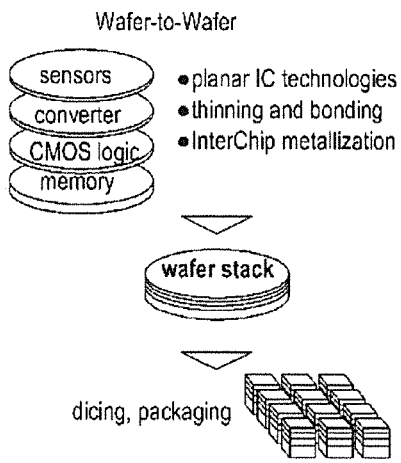
FIG. 3(b)
(Prior Art)
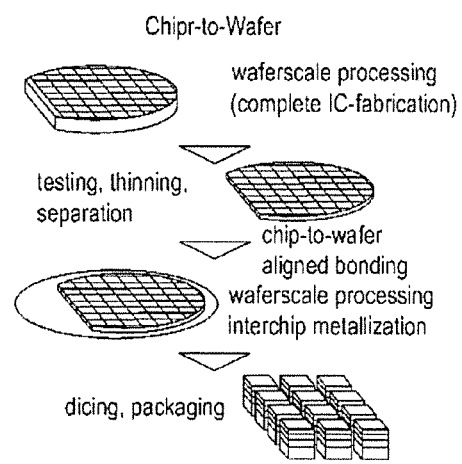
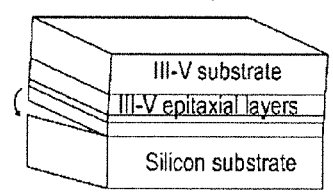
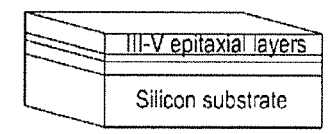
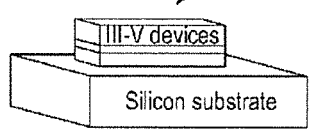
FIG. 3(c)
(Prior Art)
FIG. 4
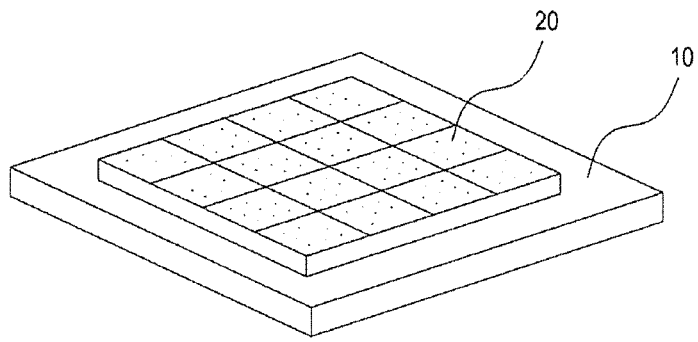

INTEGRATED CIRCUIT EMULATING NEURAL SYSTEM WITH NEURON CIRCUIT AND SYNAPSE DEVICE ARRAY AND FABRICATION METHOD THEREOF

CROSS-REFERENCE TO RELATED APPLICATION

This application claims priority to Korean Patent Application Nos. 10-2017-0062097, filed on May 19, 2017 and 10-2017-0153493, filed on Nov. 17, 2017, under 35 U.S.C. 119, the entire contents of which are hereby incorporated by reference.

BACKGROUND

Field of the Invention

The present invention relates to an integrated circuit emulating a neural system, and more particularly to an integrated circuit emulating a neural system with a neuron circuit and a synapse device array combined to upper and lower layers, respectively, and a fabrication method thereof.

Description of the Related Art

Recently, in the tide of technological change called the Fourth Industrial Revolution, the core technology is firmly artificial intelligence. In recent years, efforts have been made to implement the functions of human neural system accurately by hardware through semiconductor devices and circuits, in contrast to conventional artificial intelligence technology which has been performed mainly by software and algorithms.

The human neural system consists largely of the central nervous system and the peripheral nervous system. In the central nervous system, the human brain has about 100 billion neurons. Each neuron makes about 1,000 connections called synapses to other neurons. There are about 100 trillion synapses. The peripheral nervous system consists of sensory and motor neurons connected to the central nervous system as an interneuron.

Neuron mimetic circuits, i.e. ones using a semiconductor device for imitating a synapse, are known by not only a capacitor-based axon-hillock circuit (Giacomo Indiveri et al., Neuromorphic silicon neuron circuits, Frontiers in Neuroscience, Vol. 5, Article 73, May, 2011), but also one using a floating body device of Korean Patent No. 10-1528802 invented by one of the present inventors.

When a human brain neural system (i.e., a central nervous system) composed of about 100 trillion synapses and a peripheral nervous system connected thereto are implemented with semiconductor devices and circuits, a large number (at least 100 trillion) of semiconductor devices and circuits connected thereto have to be implemented as a single system, i.e. an integrated circuit.

There is a problem that it is difficult to implement the human neural system by the semiconductor integrated system technology developed so far. In the meantime, the semiconductor integrated system techniques with SoC (System on Chip) and SiP (System in Package) have been developed from techniques for stacking chips in three dimensions (see FIG. 1a) according to the development of packaging techniques, as shown in FIGS. 1(a)-1(c) and 3(a)-3(c), to techniques for stacking wafers (see FIGS. 1c and 3a). In addition, there are various techniques such as a heterogeneous integration for microsystems (see FIGS. 1c and 3a), a technique for manufacturing Chip-to-Wafer (see FIG. 3b), and a heterogeneous semiconductor substrate bonding technique (see FIG. 3c). The advantages and disadvantages of the bonding technique are known as shown in FIG. 2.

However, it is difficult to implement for reflecting the characteristics of the human brain neural system (i.e., the central nervous system) and the peripheral nervous system by the conventional semiconductor integrated system techniques.

SUMMARY

The present invention is to provide an integrated circuit emulating a neural system with a neuron circuit and a synapse device array, and a fabricating method thereof. In the present invention, the synapse device array is formed by stacking with one or more layers on a lower portion for mimicking a brain neural system (i.e., a central nervous system) that requires a high integration on the same substrate and the neuron circuit is formed on an upper portion for mimicking a peripheral nervous system consisted of sensory and motor neurons that are connected to the brain neural system.

To achieve the objectives, an integrated circuit emulating a neural system according to the present invention comprises a predetermined substrate; a synapse device array layer formed by stacking one or more layers interlaying with an interlayer insulating film on the substrate; and a neuron circuit layer formed on the synapse device array layer interlaying with an insulating film.

The synapse device array layer and the neuron circuit layer may be formed by stacking polysilicon layers on the substrate.

Each of the polysilicon layers may have a thickness of 3 μm or less.

The synapse device array layer may have a plurality of synapse mimetic devices, and the neuron circuit layer may have sensory and motor neuron mimetic circuits electrically connected to one or more of the synapse mimetic devices.

Electrical connections between the sensory and motor neuron mimetic circuits and the synapse mimetic devices and wirings in the neuron circuit layer and the synapse device array layer may be formed of metal or highly doped polysilicon.

A fabricating method of an integrated circuit emulating a neural system according to the present invention comprises a first step of forming $1^{st}$ to Nth synapse device array with $1^{st}$ to Nth polysilicon layer formed on a predetermined substrate interlaying with an interlayer insulating film, and a second step of forming a neuron circuit with an N+1th polysilicon layer formed on the Nth polysilicon layer interlaying with an insulating film.

The Nth polysilicon layer and the N+1th polysilicon layer may have a thickness of 3 μm or less.

The Nth synapse device array may be formed of a plurality of synapse mimetic devices, the neuron circuits may be formed with sensory and motor neuron mimetic circuits, and a connecting step of electrically connecting one or more of the synapse mimetic devices to the sensory and motor neuron mimetic circuits may be further performed after the second step.

The present invention enables to provide a high-density synapse device array layer with a relatively large number of processes on a lower portion and a neuron circuit with little influence on the lower devices by having a large circuit unit area and a relatively small number of processes on an upper portion. By this configuration, the present invention can increase the thermal budget in the processes, ensure stable production and reliability through sequential processes, have the interlayer connection process without high-temperature high-pressure and adhesive material required for the conventional interlayer physical bonding and enhance the integration degree of the circuit emulating a neural system through a three-dimensional stacking on a single substrate.

BRIEF DESCRIPTION OF THE DRAWINGS

FIGS. 1(a)-(c) and 3(a)-3(c) show a concept of a conventional semiconductor integrated system techniques, in which the FIG. 1(a) shows a technique of stacking chips, the FIGS. 1(b) and 3(a) show a wafer-to-wafer technique, FIG. 1(c) shows heterogeneous integrated technique for microsystem, FIG. 3(b) shows chip-to-wafer manufacturing technique, and FIG. 3(c) shows a heterogeneous semiconductor substrate boding technique.

FIG. 2 is a table showing advantages and disadvantages of the conventional boding technique.

FIGS. 4 to 8 are schematic process views according to an embodiment of the present invention.

In these drawings, the following reference numbers are used throughout: reference number 10 indicates a substrate, 20, 22, 24, 26 and 28 a synapse device array (layer), 14 a drain supporter, 30 an interlayer insulating film, 42 a neuron circuit block, 50 a connection plug and 60 wiring.

DETAILED DESCRIPTION

Detailed descriptions of preferred embodiments of the present invention are provided below with accompanying drawings.

Figure 7:
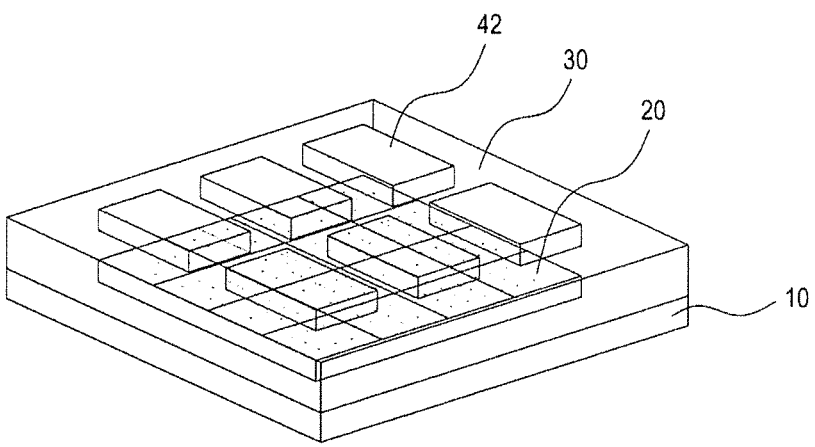
Figure 8:
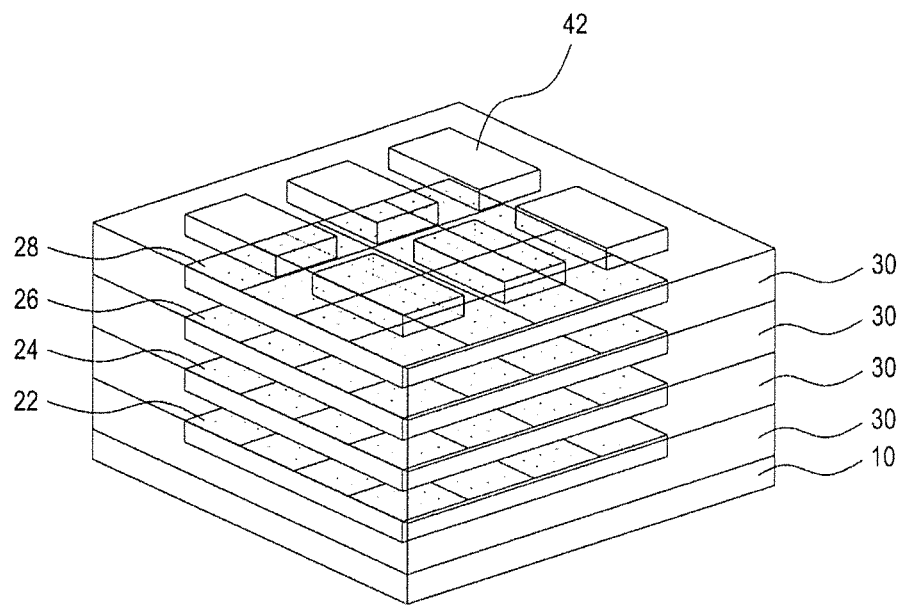
Figure 9:
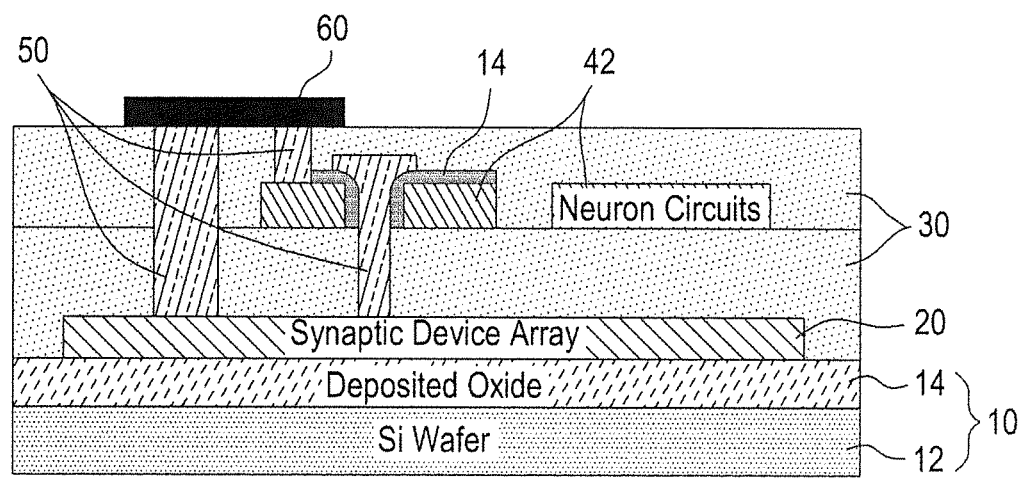
FIG. 9 is a cross-sectional view of an integrated circuit emulating a neural system according to an embodiment of the present invention.

An integrated circuit emulating a neural system according to the present invention comprises, as commonly shown in FIGS. 7 to 9, a predetermined substrate 10 or 12 and 14; a synapse device array layer 20 formed by stacking one or more layers 22, 24, 26 and 28 interlaying with an interlayer insulating film 30 on the substrate 10; and a neuron circuit layer 42 formed on the synapse device array layer 20 interlaying with an insulating film 30.

Here, the substrate 10 may be made of any insulting material and, as shown in FIG. 9, may be a substrate deposited with an oxide film 14 on a semiconductor substrate 12 such as a silicon substrate, etc.

The synapse device array layer may have a plurality of synapse mimetic devices and can be formed as one layer 20 on the substrate 10, as in the embodiment of FIG. 7. However, as in the embodiment of FIG. 8, it can be formed as two or more layers 22, 24, 26 and 28 interlaying with an interlayer insulating film 30.

The plurality of synapse mimetic devices may be formed of any devices that imitate long-term memory and short-term memory of brain cells. For example, a floating body device developed by one of the present inventors in Korean Patent No. 10-1528802 can be used. By forming a synapse device array layer with a plurality of synapse mimetic devices that imitate the long- and short-term memories of brain cells, it is possible to implement an integrated circuit emulating a neural system capable of deep learning.

The neuron circuit layer may have sensory and motor neuron mimetic devices electrically connected to one or more of the synapse mimetic devices. As shown in FIGS. 7 and 8, the neuron circuit layer can be formed of a plurality of neuron circuit blocks 42 on the synapse device array layer 20; 22, 24, 26 and 28.

The sensory neuron mimetic circuit among the plurality of neuron circuit blocks 42 can comprise a receiver (i.e., a sensory receptor) receiving external stimuli, a sensory neuron mimetic device converting the external stimuli received from the receiver into electric signals, and a signal transporter collecting the electric signals received from the sensory neuron mimetic device and transferring them to one or more of the synapse mimetic devices.

The motor neuron mimetic circuit among the plurality of neuron circuit blocks 42 can comprise a motor neuron mimetic device converting electric signals received from one or more of the synapse mimetic devices into output signals (such as a muscle stimulus, etc.) and an output portion receiving the output signals and displaying them on the outside.

Electrical connection between the neuron circuit layer 42 and the synapse device array layer 20, 22, 24, 26 or 28 can be achieved by etching a part of the upper layer to form a mesa structure. It is preferable that a vertical connection hole (a via hole) penetrating through the interlayer insulating film 30 and/or the lower synapse device array layer 22, 24 or 26 is formed and filled with metal or highly doped polysilicon for the electrical connection.

Especifically, as in the embodiment of FIG. 9, a vertical connection plug 50 for electrical connecting from a sensory and motor neuron mimetic circuit as a neuron circuit block 42 to a plurality of synapse mimetic devices of a synapse device array layer 20 and wirings 60 in the neuron circuit layer and the synapse device array layer can be formed of metal or highly doped polysilicon.

Figure 6:
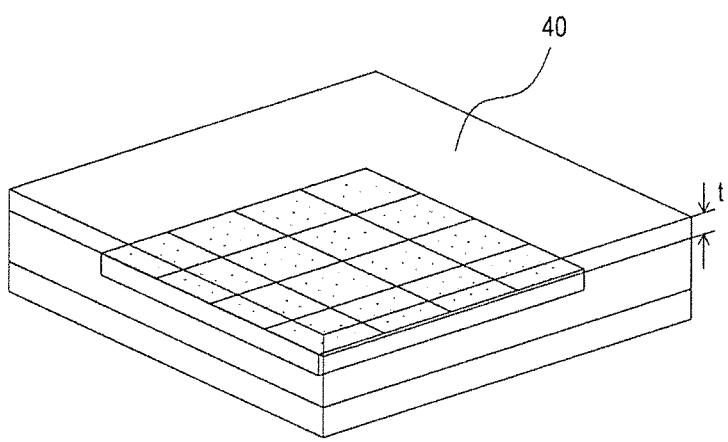

The synapse device array layer 20; 22, 24, 26 and 28 and the neuron circuit layer 42 can be formed of any material capable of implementing a plurality of synapse mimetic devices or sensory and motor neuron mimetic circuits. As shown in FIGS. 6 and 8, it is preferable that polysilicon layers 40 as the synapse device array layer 20; 22, 24, 26 and 28 and the neuron circuit layer 42 are repeatedly stacked on the substrate 10 interlaying with an interlayer insulating film 30.

At this time, it is preferable that the thickness (t) of each polysilicon layer 40 is 3 µm or less to ensure transparency, because it is possible to perform optical alignment with the lower circuit in the process. Further, it is more preferable that the thickness (t) of the polysilicon layer 40 is 100 nm or less in order to improve the gate controlling force of the synapse mimetic devices and sensory or motor neuron mimetic devices formed in each layer.

On the other hand, a fabricating method of an integrated circuit emulating a neural system according to the present invention comprises, as shown in FIG. 8, a first step of forming $1^{st}$ to Nth synapse device array with $1^{st}$ to Nth polysilicon layer 22, 24, 26 or 28 formed on a predetermined substrate 10 interlaying with an interlayer insulating film 30; and a second step of forming a neuron circuit with an N+1 th polysilicon layer 42 formed on the Nth polysilicon layer 22, 24, 26 or 28 interlaying with an insulating film 30.

Here, N is a natural number equal to or greater than 1. FIGS. 4 to 7 show schematic process views when N=1, and FIG. 8 shows an embodiment when N=4.

The substrate 10 may be made of any insulating material as described above and may be a substrate deposited with an oxide film on a semiconductor substrate such as a silicon substrate, etc.

Figure 5:
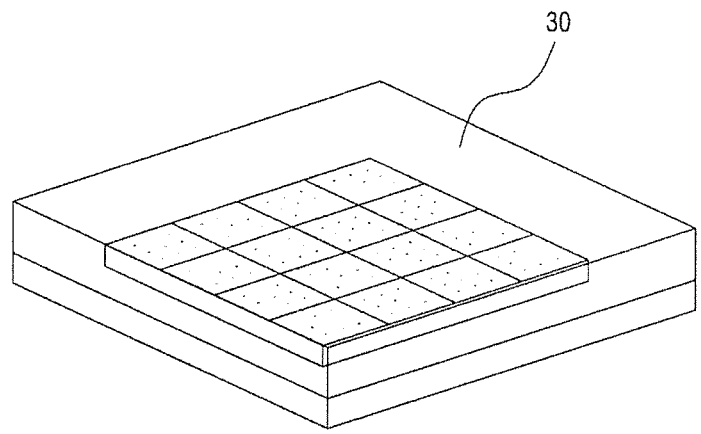

According to the embodiment of FIGS. 4 to 7, first, as shown in FIG. 4, a first polysilicon layer may be formed directly on a silicon substrate 10 deposited with an oxide film to form a synapse device array 20 and followed by forming an interlayer insulating film 30 as shown in FIG. 5, and then a second polysilicon layer 40 may be formed as shown in FIG. 6.

At this time, the second polysilicon layer 40 is preferably formed to have a thickness (t) of 3 µm or less like the first polysilicon layer. As described above, the polysilicon layer 40 has such a thickness that the lower circuit can be seen. By doing this, it is possible to perform optical alignment with the lower circuit (for example, a connection hole formed in the interlayer insulating film to make electrical contact with the lower synapse device array, etc.) in the photolithography process. Further, for the same reason described above, it is more preferable that the thicknesses (t) of the first and second polysilicon layers 40 are all 100 nm or less.

Next, as shown in FIG. 7, in the second polysilicon layer 40, neuron circuits such as sensory and motor neuron mimetic circuits may be formed as a plurality of neuron circuit blocks 42.

FIG. 8 shows an embodiment when N=4. Polysilicon layers 22, 24, 26, and 28 can be repeatedly formed to form synapse device arrays and neuron circuits can be formed on the uppermost layer interlaying with an interlayer insulating film 30. By doing this, it is possible to implement an integrated circuit emulating a neural system such as a human neural system.

That is, the lower polysilicon layers can be repeatedly stacked to form a synapse device array with high integration for about 100 trillion synapse mimetic devices corresponding to a human brain neural system (i.e., a central nervous system) and the upper polysilicon layer can be formed to implement neuron circuits emulating sensory and motor neurons corresponding to a human peripheral nervous system. By doing this, it is possible to implement an integrated circuit emulating a neural system such as a human neural system.

As described above, the integrated circuit emulating a neural system according to the present invention can provide a high-density synapse device array layer with a relatively large number of processes on a lower portion and neuron circuits with little influence on the lower devices by having a large circuit unit area and a relatively small number of processes on an upper portion. By this configuration, the present invention can increase the thermal budget in the processes, ensure stable production and reliability through sequential processes, have the interlayer connection process without high-temperature high-pressure and adhesive material required for the conventional interlayer physical bonding and enhance the integration degree of the circuit emulating a neural system through a three-dimensional stacking on a single substrate.

As described above, by forming the synapse device array layer with a plurality of synapse mimetic devices mimicking the long- and short-term memories of human brain cells, it is possible to implement an integrated circuit emulating a neural system capable of deep learning.

The connecting step of electrically connecting one or more synapse mimetic devices to the sensory and motor neuron mimetic circuits can be performed whenever the interlayer insulating film 30 is formed on the Nth polysilicon layer or can be performed only one time as a connection hole (a via hole) forming process after the N+1th polysilicon layer for neuron circuits is formed. The wirings of each layer can be formed and the connection holes can be filled with metal or highly doped polysilicon.

Of course, after forming each of the interlayer insulating films 30 and a planarization process, the polysilicon layers 22, 24, 26, and 28 may be deposited.

This work was supported by the Nano•Material Technology Development Program through the National Research Foundation of Korea (NRF) funded by the Ministry of Science, ICT and Future Planning (MSIP) under Grant 2016M3A7B4910348.

What is claimed is:

1. An integrated circuit emulating a neural system comprising:
    a substrate;
    synapse device layers stacked vertically;
    insulating film disposed so that the insulating film is on the substrate and between the synapse device layers; and
    a neuron circuit layer composed of a plurality of neuron circuit blocks, the neuron circuit blocks being disposed over the synapse device layers such that the insulating film is between the neuron circuit blocks and the synapse device layers,
    wherein each of the synapse device array layers comprises a plurality of synapse mimetic devices, and
    wherein there are more of the synapse device layers than the neuron circuit layer.

2. The integrated circuit emulating a neural system of claim 1,
    wherein the synapse device layers and the neuron circuit layer are polysilicon layers.

3. The integrated circuit emulating a neural system of claim 2,
    wherein each of the polysilicon layers has a thickness of 3 µm or less.

4. The integrated circuit emulating a neural system of claim 1,
    wherein the plurality of synapse mimetic devices are floating body devices that imitate long-term and short-term memories of brain cells, and
    wherein the neuron circuit layer has sensory and motor neuron mimetic devices electrically connected to one or more of the synapse mimetic devices.

* * * * *